US009899046B2

United States Patent
Lui et al.

(10) Patent No.: US 9,899,046 B2
(45) Date of Patent: Feb. 20, 2018

(54) METHOD OF TESTING ANTI-HIGH TEMPERATURE PERFORMANCE OF A MAGNETIC HEAD AND APPARATUS THEREOF

(75) Inventors: Cheukman Lui, Hong Kong (CN); Chiuming Lueng, Hong Kong (CN); Hokei Lam, Hong Kong (CN); Mankit Lee, Hong Kong (CN); Kwokkam Leung, Hong Kong (CN); Cheukwing Leung, Hong Kong (CN); Juren Ding, Hong Kong (CN); Rongkwang Ni, Hong Kong (CN)

(73) Assignee: SAE Magnetics (H.K.) Ltd., Hong Kong (CN)

(*) Notice: Subject to any disclaimer, the term of this patent is extended or adjusted under 35 U.S.C. 154(b) by 829 days.

(21) Appl. No.: 13/064,993

(22) Filed: Apr. 29, 2011

(65) Prior Publication Data

US 2012/0275047 A1 Nov. 1, 2012

(51) Int. Cl.
*G11B 5/455* (2006.01)
*G11B 20/18* (2006.01)
*G11B 27/36* (2006.01)
*G01R 33/12* (2006.01)

(52) U.S. Cl.
CPC .......... *G11B 5/455* (2013.01); *G01R 33/1207* (2013.01); *G11B 5/4555* (2013.01); *G11B 20/1816* (2013.01); *G11B 27/36* (2013.01)

(58) Field of Classification Search
USPC ................................................. 324/210, 201
See application file for complete search history.

(56) References Cited

U.S. PATENT DOCUMENTS

| | | | | |
|---|---|---|---|---|
| 5,227,212 A * | 7/1993 | Ahlert | ................... | G11B 5/656 360/135 |
| 6,178,054 B1 * | 1/2001 | Wakefield | ............. | G11B 5/012 360/31 |
| 6,181,493 B1 * | 1/2001 | Wakefield | ............. | G11B 5/012 360/31 |
| 6,943,545 B2 * | 9/2005 | Patland | ................... | G11B 5/02 324/210 |
| 7,538,546 B2 * | 5/2009 | Patland | ................ | H01F 7/0273 324/210 |
| 7,683,610 B2 * | 3/2010 | Shimazawa | ........ | G01R 33/1207 324/210 |
| 7,960,968 B2 * | 6/2011 | Kiyono | ................. | B82Y 25/00 29/603.09 |
| 2008/0049351 A1 | 2/2008 | Yamanaka et al. | | |
| 2009/0128941 A1 * | 5/2009 | Taratorin | ............... | G11B 5/455 360/31 |

(Continued)

*Primary Examiner* — Jermele M Hollington
*Assistant Examiner* — Christopher McAndrew
(74) *Attorney, Agent, or Firm* — Nixon & Vanderhye PC (57) ABSTRACT

A method of testing anti-high temperature performance of a magnetic head comprises applying a plurality of second magnetic fields with different intensities in a second direction to the magnetic head, and measuring a second output parameter curve, and judging whether a variation that is beyond an allowable value is presented on the second output parameter curve, therein the second direction passes through the ABS and at an angle whose absolute value is an acute angle to the ABS. The present invention can screen out defective magnetic heads that possess poor anti-high temperature performance without heating the magnetic head.

42 Claims, 11 Drawing Sheets

(56) References Cited

U.S. PATENT DOCUMENTS

2009/0147389 A1* 6/2009 Taratorin ............. G11B 5/3166
360/31
2009/0261228 A1* 10/2009 Merrow ............. G05D 23/1928
248/550

* cited by examiner

(The first example)
under the first magnetic field in the first direction
perpendicular to the ABS

Fig. 7a (The first example)
under the second magnetic field in the second direction that
passes through the ABS and at -9° to the ABS

METHOD OF TESTING ANTI-HIGH TEMPERATURE PERFORMANCE OF A MAGNETIC HEAD AND APPARATUS THEREOF

FIELD OF THE INVENTION

The present invention relates to a method of testing the performance of a magnetic head and, more particularly to a method of testing the anti-high temperature performance of a magnetic head. Moreover, the present invention relates to an apparatus for testing the performance of a magnetic head, and an apparatus for testing the anti-high temperature performance of a magnetic head particularly.

BACKGROUND OF THE INVENTION

Hard disk drive incorporating rotating magnetic disks is commonly used for storing data in the magnetic media formed on the disk surfaces, and a movable head are generally used to read data from and write date into tracks on the disk surfaces.

Nowadays, the magnetoresistive (MR) read heads are widely used in a popular magnetic head because a MR element with higher sensitivity is included therein. A plurality of performance of a magnetic head must be tested before the magnetic head is used, which includes anti-high temperature performance, dynamic flying height (DFH) performance, Signal-to-Noise Ratio (SNR) performance, reliability, stability and the like. For example, a magnetic head with a bad anti-high temperature performance will represent a lot of noise if used under a high temperature condition. And a magnetic head having a bad SNR performance will damage the reading stability of the magnetic head and affect the reading performance finally. Thus, the testing of the performance of the magnetic head is quite important and necessary.

Figure 1:
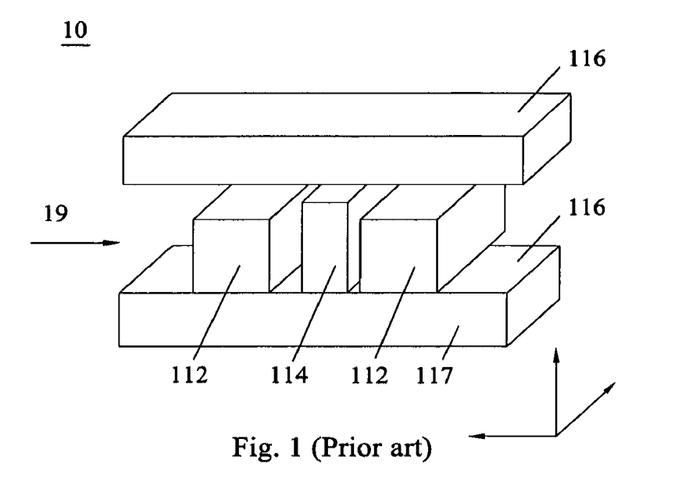
FIG. 1 is a simplified and partial perspective view of a MR read head that shows a common magnetization direction.

The following method has been used as a conventional method of testing a MR read head. As shown in FIG. 1, the MR read head 10 includes two hard magnets 112, a MR element 114 sandwiched between the two hard magnets 112, and two shielding layers 116 disposed on both sides of the MR element 114 and the hard magnets 112. As known, the resistance of the MR element varies with the changes of an external magnetic field, which results in variation in the output of the MR read head. An operation that applies a magnetic field in a direction 19 that is parallel to the shielding layers 116 and at 0° angle to the air bearing surface 117 (ABS) of the MR read head 10 (hereinafter this is referred to as "common magnetization direction") and measures the output voltage of the MR read head 10 is repeatedly carried out. And the difference between the highest and lowest output voltage is calculated as the variation and used to evaluate whether the output variation is within a certain allowable value. Therefore, the tested magnetic head will be rejected as a defective magnetic head if the output variation is beyond the allowable value. More commonly, another magnetic field in another direction 18 that is perpendicular to the ABS 117 is applied, and an output voltage can be measured according to the magnetic field, by which the performance of the magnetic head can be detected.

The above-mentioned method applying the magnetic field with the common magnetization direction and the direction perpendicular to the ABS is widely used in the testing of DFH performance, SNR performance, the reliability and the stability of the magnetic head. However, the testing by using the above magnetizations is limited since the performance requirement of the magnetic head become higher and higher. Thus, the testing method is limited to a degree. With regard to the anti-high temperature testing, there is little sensitivity responding to the magnetization with the common magnetization direction, however. Thus, methods of testing the anti-high temperature for the magnetic head are still under development.

Figure 2:
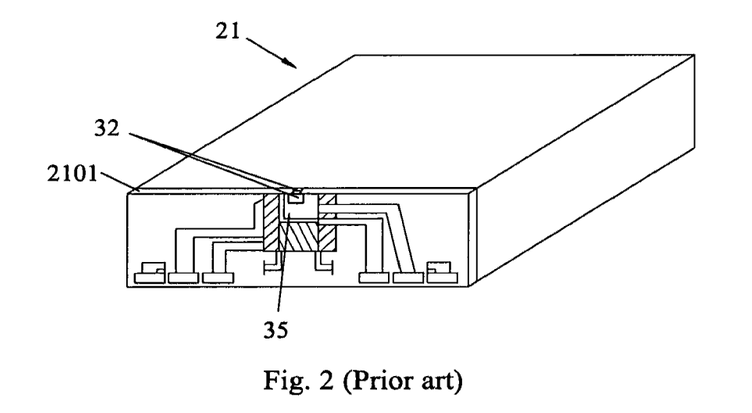
FIG. 2 is a perspective view of a magnetic head that shows a conventional testing method.

US patent publication No. 20080049351 A1 discloses a testing method of the anti-high temperature for the magnetic head. As shown in FIG. 2, a heating element 35 is provided on an element formation surface 2101 of the magnetic heads 21, so as to applying heat and stress to the MR element 32 of the magnetic head 21. Concretely, the heating element 35 generates heat when electric current is passed through it. A large internal stress is generated in the MR element 32 due to the thermal expansion of the MR element 32 caused by heat generated by the heating element 35 and the thermal expansion of the material surrounding the MR element 32, in addition to internal distortion inherent in the MR element 32. The level of noise that occurs in an output of the MR element 32 is measured under these conditions to identify whether or not the magnetic head 21 has a potential distortion that can cause noise under high-temperature conditions.

However, since the magnetic head is tested under a plurality of changing high-temperature conditions repeatedly, thus the selection and controlling of the sample temperature need to be precise. If the temperature is too high, there is a potential of damaging the non-defective magnetic head during the testing.

Moreover, this method mentioned above is only suitable for the magnetic head with a heating element equipped therein. The anti-high temperature testing is incapable of being performed in the case that the heating element is failed to be equipped in the magnetic head.

Hence, it is desired to provide an improved method of testing anti-high temperature performance of a magnetic head, and a method of testing the performance of a magnetic head to overcome the above-mentioned drawbacks.

SUMMARY OF THE INVENTION

One objective of the present invention is to provide a method of testing anti-high temperature performance of a magnetic head, which can screen out defective magnetic heads that possess poor anti-high temperature performance without heating the magnetic head.

Another objective of the present invention is to provide a method of testing the performance of a magnetic head, which can test defective magnetic head that could not be completely detected by a conventional testing method that uses common magnetization.

Yet another objective of the present invention is to provide an apparatus for testing anti-high temperature performance of a magnetic head, which can screen out defective magnetic heads that possess poor anti-high temperature performance without heating the magnetic head.

Still a further objective of the present invention is to provide an apparatus for testing the performance of a magnetic head, which can test defective magnetic head that could no be completely detected by a conventional testing method that uses common magnetizations.

To achieve the above objectives, a method of testing anti-high temperature performance of a magnetic head, the magnetic head includes two shielding layers and an ABS, and the method comprises applying a plurality of first magnetic fields with different intensities in a first direction to the magnetic head, and measuring a first output parameter curve, the first direction being perpendicular to the ABS; applying a plurality of second magnetic fields with different intensities in a second direction to the magnetic head, and measuring a second output parameter curve, the second direction passing through the ABS and at an angle whose absolute value is an acute angle to the ABS; and judging whether a variation that is beyond an allowable value is presented on the first output parameter curve and the second output parameter curve, thereby screening out a defective magnetic head.

As a preferred embodiment, the method further comprises controlling the magnetic head to make the ABS parallel to a horizontal plane, and then applying the second magnetic fields to the magnetic head.

As another preferred embodiment, the method further comprises controlling the magnetic head to make the ABS at the angle whose absolute value is an acute angle to a horizontal plane, and then applying the second magnetic fields to the magnetic head.

Preferably, the angle is in a range of −20°~20°, but 0° exclusive.

Preferably, the first direction and the second direction go in the ABS and/or go out from the ABS.

Alternatively, the method further comprises applying a third magnetic field with a third direction to the magnetic head, and the third direction is parallel to the shielding layers and at 0° angle to the ABS.

Preferably, the intensity of the first magnetic field and the second magnetic field are in a range of −800 Oe~800 Oe.

Preferably, the first output parameter curve and the second output parameter curve are represented by output voltage.

Alternatively, the first output parameter curve and the second output parameter curve are represented by signal-to-noise ratio.

Preferably, the variation has a maximum jumping that has a jumping ratio, and the jumping ratio of the allowable value is 8%.

A method of testing the performance of a magnetic head, the magnetic head includes two shielding layers and an ABS, and the method comprises applying a second magnetic filed in a second direction passing through the ABS and at an angle whose absolute value is an acute angle to the ABS to the magnetic head, measuring an output parameter of the magnetic head, and repeating the applying of different magnetic fields and measuring a plurality of times, thereby testing the performance of the magnetic head.

As a preferred embodiment, the method further comprises controlling the magnetic head to make the ABS parallel to a horizontal plane, and then applying the second magnetic fields to the magnetic head.

As another preferred embodiment, the method further comprises controlling the magnetic head to make the ABS at the angle whose absolute value is an acute angle to a horizontal plane, and then applying the second magnetic fields to the magnetic head.

Preferably, the angle is in a range of −20°~20°, but 0° exclusive.

Preferably, the second direction goes in the ABS and/or goes out from the ABS.

Alternatively, the method further comprises a first magnetic field in a first direction that is perpendicular to the ABS to the magnetic head.

Alternatively, the method further comprises applying a third magnetic field with a third direction that is parallel to the shielding layers and at 0° angle to the ABS to the magnetic head.

Preferably, the intensity of the second magnetic field are in a range of −800 Oe~800 Oe.

Preferably, the output parameter is represented by output voltage.

Alternatively, the output parameter is represented by signal-to-noise ratio.

Preferably, the variation has a maximum jumping that has a jumping ratio, and the jumping ratio of the allowable value is 8%.

Accordingly, an apparatus for testing anti-high temperature performance of a magnetic head, the magnetic head includes two shielding layers and an ABS, and the apparatus comprises a first magnetic field generating unit for applying a plurality of first magnetic fields with different intensities in a first direction to the magnetic head, the first direction being perpendicular to the ABS; a first measuring unit for measuring a first output parameter curve according to the first magnetic fields; a second magnetic field generating unit for applying a plurality of second magnetic fields with different intensities in a second direction to the magnetic head, the second direction passing through the ABS and at an angle whose absolute value is an acute angle to the ABS; a second measuring unit for measuring a second output parameters according to the second magnetic fields; and a judging unit for judging whether a variation that is beyond an allowable value is presented on the first output parameter curve and the second output parameter curve, thereby screening out a defective magnetic head.

An apparatus for testing the performance of a magnetic head, the magnetic head includes two shielding layers and an ABS, and the apparatus comprises a second magnetic field generating unit for repeating to apply second magnetic fields with different intensities in a second direction passing through the ABS and at an angle whose absolute value is an acute angle to the ABS to the magnetic head; and a measuring unit for measuring output parameters of the magnetic head according to the second magnetic fields, thereby testing the performance of the magnetic head.

In comparison with the prior art, the present invention applies a second magnetic field in a second direction that passes through the ABS and at an angle whose absolute value is an acute angle to the ABS and measures out the output of the magnetic head, and repeats the magnetization operation and the measurement operation for several times, and finally screens out the defective magnetic head along the several output curves. The present invention can test out the defective magnetic heads that have a lot of noises under a high temperature condition in a room temperature, without applying additional heat to the magnetic head. Thus the testing method is improved compared with the prior art. Moreover, the present invention can screen out defective magnetic heads that could not be completely detected by a conventional testing method that uses common magnetizations, and the testing precision is reliable.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings:

FIG. 5a is a cross-section view of the MR read head of the magnetic head shown in FIG. 4a;

DETAILED DESCRIPTION OF ILLUSTRATED EMBODIMENTS

Various preferred embodiments of the invention will now be described with reference to the figures, wherein like reference numerals designate similar parts throughout the various views. As indicated above, the invention is directed to a method of testing anti-high temperature performance of a magnetic head, which applies a magnetic field in a direction passing through the ABS and at an angle whose absolute value is an acute angle to the ABS to the magnetic head, so as to screen out a defective magnetic head that has a bad performance if used in a high temperature condition.

The conventional magnetic head for a slider typically includes a read portion for reading data from the disk, and a write portion for writing data into the disk. The read portion is generally formed by a MR read head, such as Current Perpendicular to Plane (CPP), Current In Plane (CIP), tunnel magnetoresistive (TMR), giant magnetoresistive (GMR), or anisotropic magnetoresistive (AMR) read heads. For being understood well, the present description only concentrates on the embodiment of the CPP-TMR read head. Obviously, the persons ordinarily skilled in the art can understand the application of the present invention on the other read heads after reading the following description.

Figure 3A:
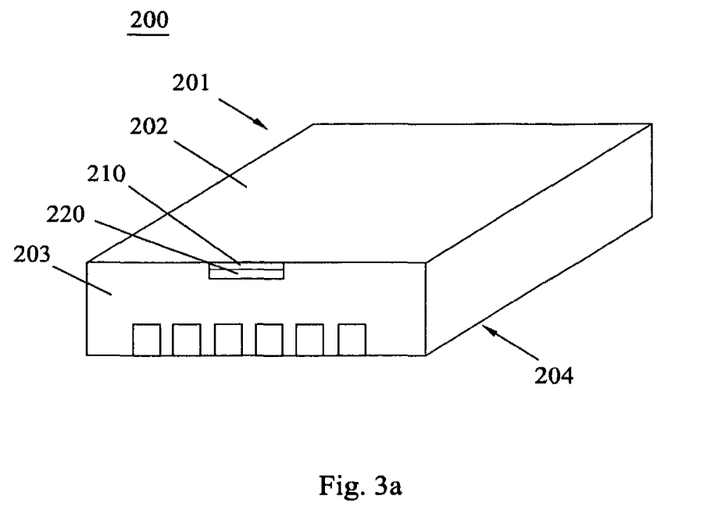
FIG. 3a is a perspective view of a magnetic head according to the present invention.
Figure 3B:
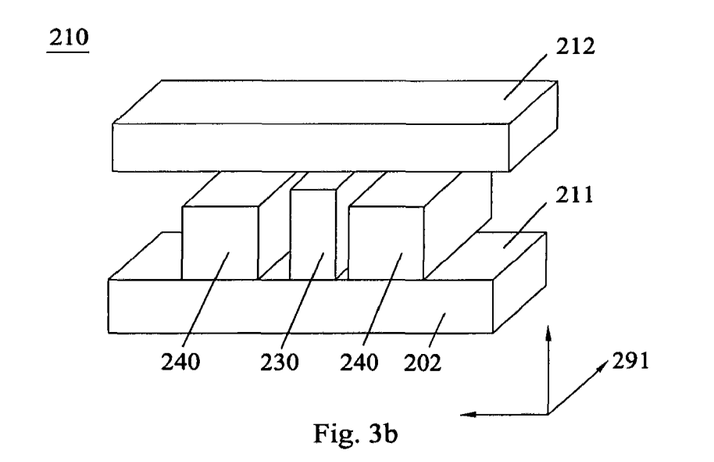
FIG. 3b is a simplified and partial perspective view of a MR read head that shows the applying of the magnetic fields with different directions according to one embodiment of the present invention.
Figure 4A:
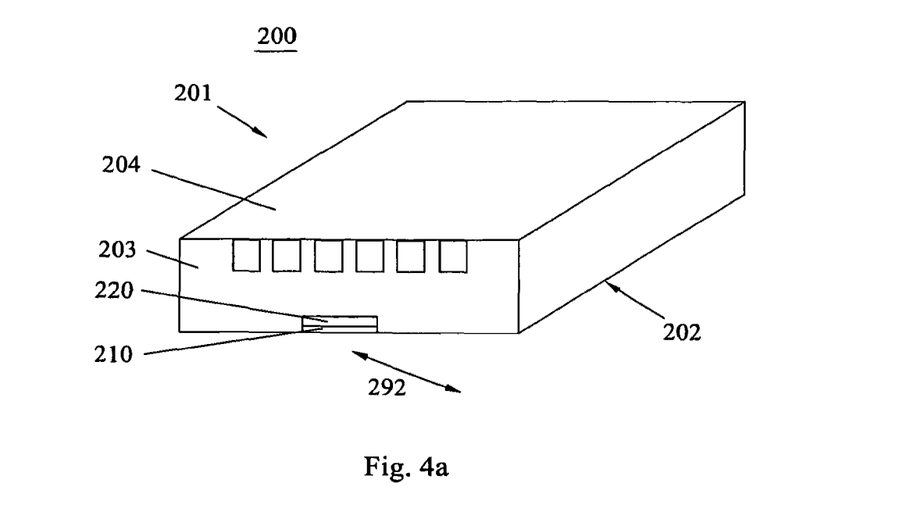
FIG. 4a shows the magnetic head is controlled to make the ABS parallel to a horizontal plane, and a second magnetic fields applied is at an acute angle to the ABS according to a first embodiment of the present invention.

FIG. 3a shows a magnetic head 200 which includes a substrate body 201, an ABS 202, a bottom surface 204 (as best shown in FIG. 4a) opposite to the ABS 202, a leading edge 203 and a trailing edge (not shown) opposite each other. The ABS 202 is processed so as to an appropriate flying height. A MR read head 210 and a write head 220 are provided on the leading edge 203. Specifically, as shown in FIG. 3b, the MR read head 210 includes a first shielding layer 211 formed on a substrate (not shown), a second shielding layer 212, and a MR element 230 sandwiched between the first and second shielding layers 211, 212. Therein, a pair of hard magnet layers 240 is sandwiched therebetween as well and respectively placed on two sides of the MR element 230.

A first magnetic field with a first direction 291 can be applied to the MR read head 210, the first direction 291 is perpendicular to the ABS 202, that is, the first magnetic field traverses the ABS 202 directly and at 90 degree to the ABS 202, which the first direction 291 is called "transverse direction". Within the contemplation of the present invention, a second magnetic field with a second direction 292 can be applied to the MR read head 210, so as to testing the characteristic and the performance of the MR read head 210, which the second direction 292 passes through the ABS 202 and at an angle whose absolute value is an acute angle to the ABS 202.

Particularly, in the practical example, the second direction 292 includes one case that the second direction 292 is tilted and at a positive angle to the ABS 202 and the other case that the second direction 292 is tilted and at a negative angle to the ABS 202, as represented in a quadrant. The absolute value of the positive angle and the negative angle is acute angle.

Figure 4B:
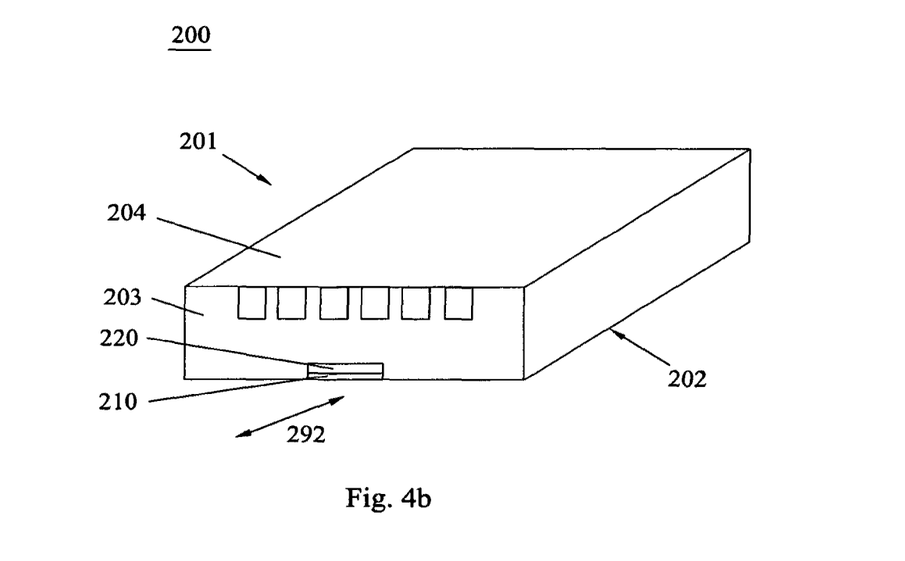
FIG. 4b shows the magnetic head is controlled to make the ABS parallel to a horizontal plane, and a second magnetic fields applied is at another acute angle to the ABS according to a second embodiment of the present invention.
Figure 5A:
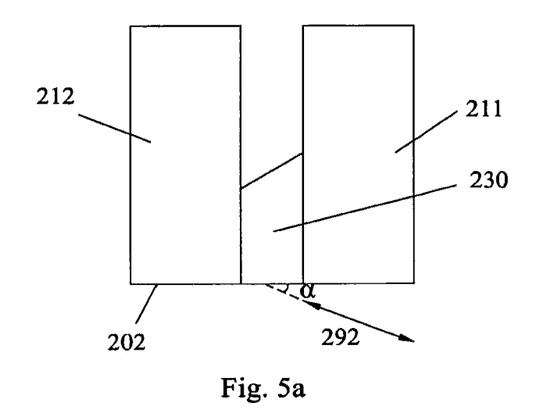
Figure 5B:
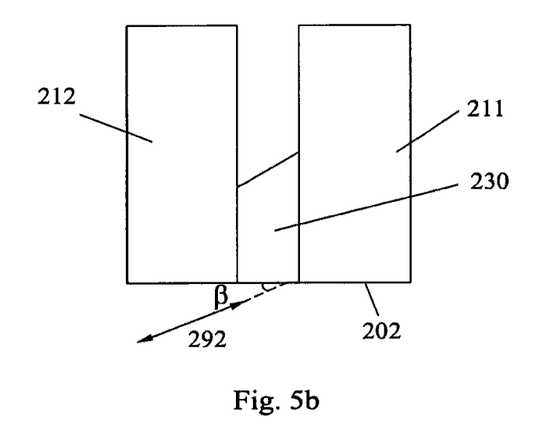
FIG. 5b is a cross-section view of the MR read head of the magnetic head shown in FIG. 4b.

For better understanding the second direction 292, FIGS. 4a and 4b shows the magnetic head 200 is controlled to make the ABS 202 parallel to a horizontal plane, and a second magnetic fields applied is at an acute angle to the ABS 202 according to two embodiments of the present invention, therein FIG. 4a shows the positive angle, and FIG. 4b shows the negative angle. FIGS. 5a and 5b is two cross-section views of the MR read head of the magnetic head shown in FIGS. 4a and 4b respectively. As best shown in FIGS. 5a and 5b, a positive angle α is shown in FIG. 5a, a negative angle β is shown in FIG. 5b.

Figure 6:
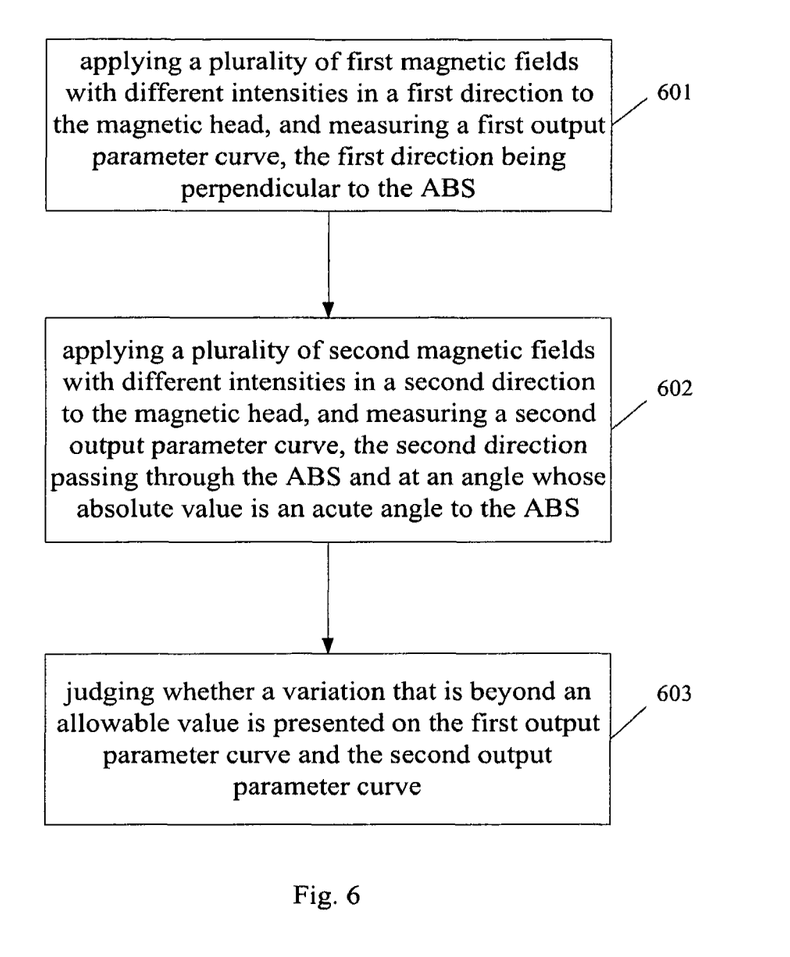
FIG. 6 is a flowchart of a method of testing anti-high temperature performance of a magnetic head according to one embodiment of the present invention.

FIG. 6 is a flowchart of a method of testing anti-high temperature performance of a magnetic head according to one embodiment of the present invention, and the method includes the following steps.

Step (601), applying a plurality of first magnetic fields with different intensities in a first direction to the magnetic head, and measuring a first output parameter curve, the first direction being perpendicular to the ABS;

Step (602), applying a plurality of second magnetic fields with different intensities in a second direction to the magnetic head, and measuring a second output parameter curve, the second direction passing through the ABS and at an angle whose absolute value is an acute angle to the ABS; and Step (603), judging whether a variation that is beyond an allowable value is presented on the first output parameter curve and the second output parameter curve, thereby screening out a defective magnetic head.

As described above, one of ways to implement the step (602) is controlling the magnetic head to make the ABS parallel to a horizontal plane, and then applying the second magnetic fields in the second direction that passes through the ABS and at an angle whose absolute value is an acute angle to the ABS, and then applying the second magnetic fields to the magnetic head. That is, the magnetic head is parallel to the horizontal plane and the second magnetic field is tilted relative to a vertical line.

The other way to implement the step (602) is controlling the magnetic head to make the ABS at the angle whose absolute value is an acute angle to a horizontal plane, and then applying the second magnetic fields in a direction perpendicular to the horizontal plane to the magnetic head. That is, the magnetic head is tilted relative to the horizontal plane when perform this implementation.

Preferably, the angle has a range of −20°~20°, but 0° exclusive. In the present invention, several samples are preferred such as −10, −9, −8, . . . −1, 1, 2, 3, . . . 10 degree. The amount of the tilted angle for testing can be one or more according to the actual demand. For ensuring the measurement precision, at least two angles selected to test is preferable.

Specifically, in the present embodiment, the output parameter is represented by output voltage, but it is not limited to it. Other output parameters such as resistance, SNR ratio also can be used to test according to the conception of the present invention.

Concretely, in the step (603), if the variation beyond the allowable value is shown on the output voltage curves, the tested magnetic head will be rejected as a defective magnetic head that opposes a bad performance (a plurality of noises may appear for example) under the high temperature condition if used under the high temperature condition; otherwise is a nondefective. As a representation, the tremendous variation has a maximum jumping with a jumping ratio that is larger than 8%. In other words, if a maximum jumping with a jumping ratio of the output curve is larger than 8%, the tested magnetic head is a defective magnetic head. Visually, the problematic magnetic head can be indicated by some shakes shown in an output parameter curve.

Preferably, the first direction and the second direction can go in the ABS and/or go out from the ABS, and the intensity of the first magnetic field and the second magnetic field are in a range of −800 Oe~800 Oe.

Alternatively, a third magnetic field with a third direction parallel to the shielding layers and at 0° angle to the ABS also can be applied to the magnetic head to test the output character of the magnetic head, if necessary.

Figure 7A:
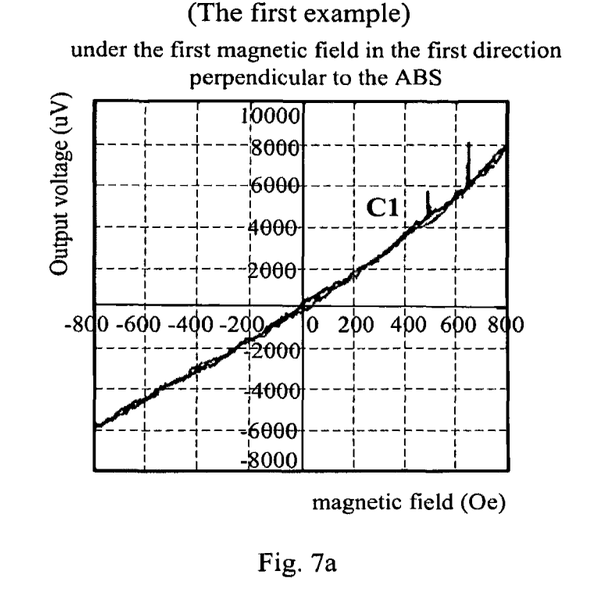
FIGS. 7a-7c show graphs of a first practical example, illustrating different output voltage curves of a first MR read head under the magnetic fields in a first direction and two second directions that is at angels −9° and +9° respectively.
Figure 7B:
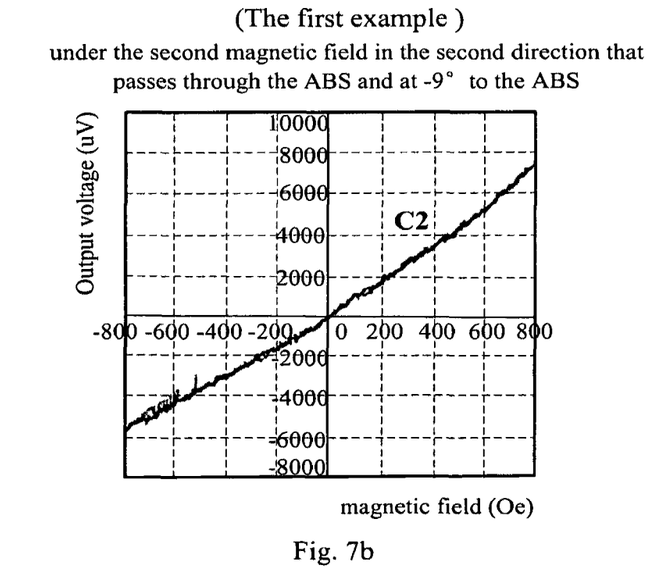
Figure 7C:
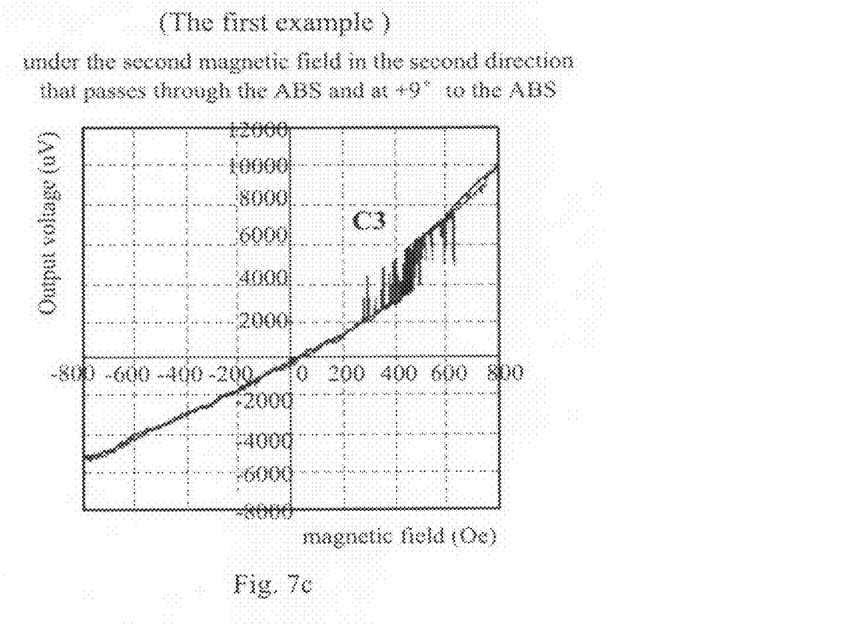

FIGS. 7a-7c show graphs of a first practical example, illustrating different output voltage curves of a first MR read head under the different magnetic fields in different directions respectively, by using the testing method according to the present invention. In the preferred embodiment, the magnetization operation and measurement of output voltage are carried out twice for each testing under the magnetic fields applied. FIGS. 7a-7c shows three conditions which includes the first magnetic field is applied in the first direction perpendicular to the ABS, and the second magnetic fields are applied in two second directions that passes through the ABS and at −9° to the ABS, and at +9° to the ABS respectively The first magnetic field and the second magnetic field has an intensity in a range of −800 Oe~800 Oe. Concretely, apply a plurality of first magnetic fields in a range of −800 Oe~800 Oe in a first direction 291 that is perpendicular to the ABS, and measure out a first output voltage curve C1. Particularly, two circles are performed in the present invention, thus two curves will be shown in a same graph for each testing.

Particularly, for the second output voltage curves, control the titled angle between the second magnetic field and the ABS is −9° and then apply a plurality of second magnetic fields in a range of −800 Oe~800 Oe under this angle, and measure out a second output voltage curve C2. Similarly, a second output voltage curve C3 is measured out under +9°.

In all of these graphs, the horizontal axis represents the magnetic field (expressed in Oe), and the vertical axis represents the output voltage (expressed in µV) from the tested magnetic head after magnetization has been carried out.

In the above graphs of output voltage curves C1~C3, it can be seen that, several great jumping appear on C3, which are under the tilted angle of +9°. Therein, the jumping ratio of the maximum jumping calculated is 16.250% in C3, which is larger than the allowable value of 8%. Thus, we can judge that the tested magnetic head is a problematic magnetic head which has a lot of noises if used in a high temperature condition.

Figure 8A:
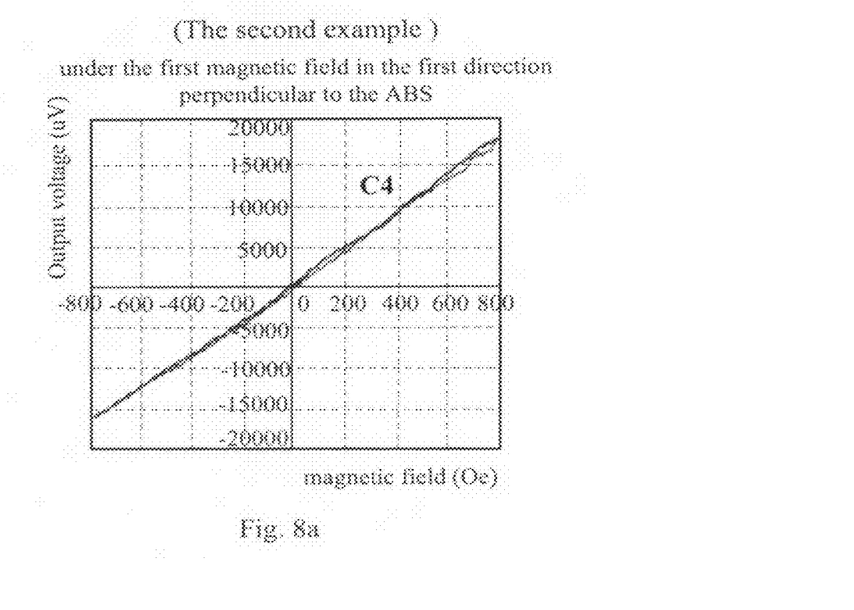
FIGS. 8a-8c show graphs of a second practical example, illustrating different output voltage curves of a second MR read head under the magnetic fields in a first direction and two second directions that is at angels −9° and +9° respectively.
Figure 8B:
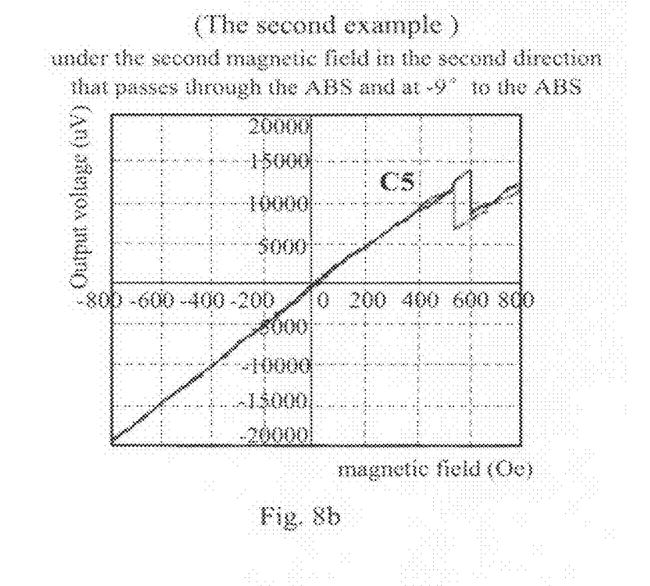
Figure 8C:
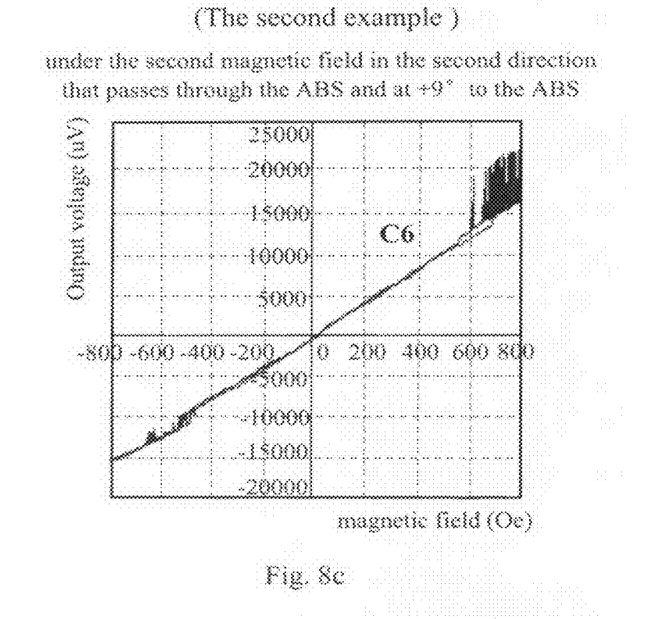

FIGS. 8a-8c show graphs of a second practical example, illustrating different output voltage curves of a second MR read head under the different magnetic fields in different directions respectively, by using the testing method according to the present invention. Similarly, FIGS. 8a~8c shows three conditions which includes the first magnetic field is applied in the first direction perpendicular to the ABS, and the second magnetic fields are applied in two second directions that passes through the ABS and at −9° to the ABS, and at +9° to the ABS respectively.

In this example, the output voltage curves C5 and C6 present great shakes, which are under the tilted angle −9° and +9°. Concretely, the jumping ratio of the maximum jumping calculated is 18.281% in C6, which is larger than the allowable value of 8%. Thus, this tested magnetic head is also a problematic magnetic head that has a bad performance if used in a high temperature condition.

Inventors experiment a plurality of samples of magnetic heads to test by using the present testing method, and find out the testing precise of the testing method is considerable. Only two representative samples are shown in the above embodiments for concision however.

In comparison with the prior art, the present invention applies a second magnetic field in a second direction that passes through the ABS and at an angle whose absolute value is an acute angle to the ABS and measures out the output of the magnetic head, and repeats the magnetization operation and the measurement operation for several times, and finally screens out the defective magnetic head along the several output curves. The present invention test out the defective magnetic heads that have a lot of noises under a high temperature condition in a room temperature, without applying additional heat to the magnetic head. Thus the testing method is improved compared with the prior art. Moreover, the present invention can screen out defective magnetic heads that could not be completely detected by a conventional testing method that uses common magnetizations, and the testing precision is reliable.

Please notice that the first direction and the second direction used in the above embodiments go in the ABS, but it's not limited here. A direction that goes out from the ABS also can be used within the conception of the present invention.

Figure 9:
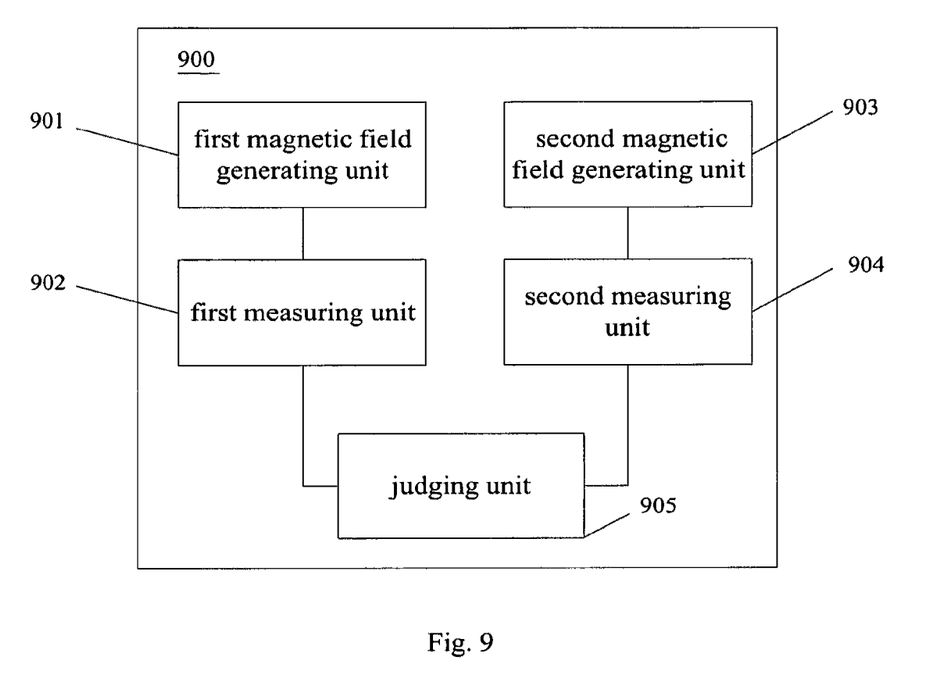
FIG. 9 shows an apparatus for testing anti-high temperature performance of a magnetic head according to one embodiment of the present invention.

Accordingly, FIG. 9 shows an apparatus for testing anti-high temperature performance of a magnetic head according to one embodiment of the present invention. As shown, the apparatus 900 includes a first magnetic field generating unit 901 for applying a plurality of first magnetic fields with different intensities in a first direction to the magnetic head, the first direction being perpendicular to the ABS, a first measuring unit 902 for measuring a first output parameter curve according to the first magnetic fields, a second magnetic field generating unit 903 for applying a plurality of second magnetic fields with different intensities in a second direction to the magnetic head, the second direction passing through the ABS and at an angle whose absolute value is an acute angle to the ABS, a second measuring unit 904 for measuring a second output parameters according to the second magnetic fields, and a judging unit 905 for judging whether a variation that is beyond an allowable value is presented on the first output parameter curve and the second output parameter curve, thereby screening out the defective magnetic head.

Concretely, the apparatus 900 further comprises a first controlling unit (not shown) for controlling the magnetic head to make the ABS parallel to a horizontal plane.

Alternatively, the apparatus 900 further comprises a second controlling unit for controlling the magnetic head to make the ABS at the angle whose absolute value is an acute angle to a horizontal plane.

Alternatively, under the different kinds of Quasi-Static Test (QST) for the magnetic head, the apparatus 900 can comprises a third magnetic field generating unit (not shown) for applying a third magnetic field with a third direction to the magnetic head, and the third direction is parallel to the shielding layers and at 0° angle to the ABS.

The apparatus 900 performs the testing by using the testing method described above, a defective magnetic head having bad performance if in a high temperature condition can be screened out with high precision. The apparatus 900 includes all corresponding technical features and all advantages described in the embodiments of the testing method.

Figure 10:
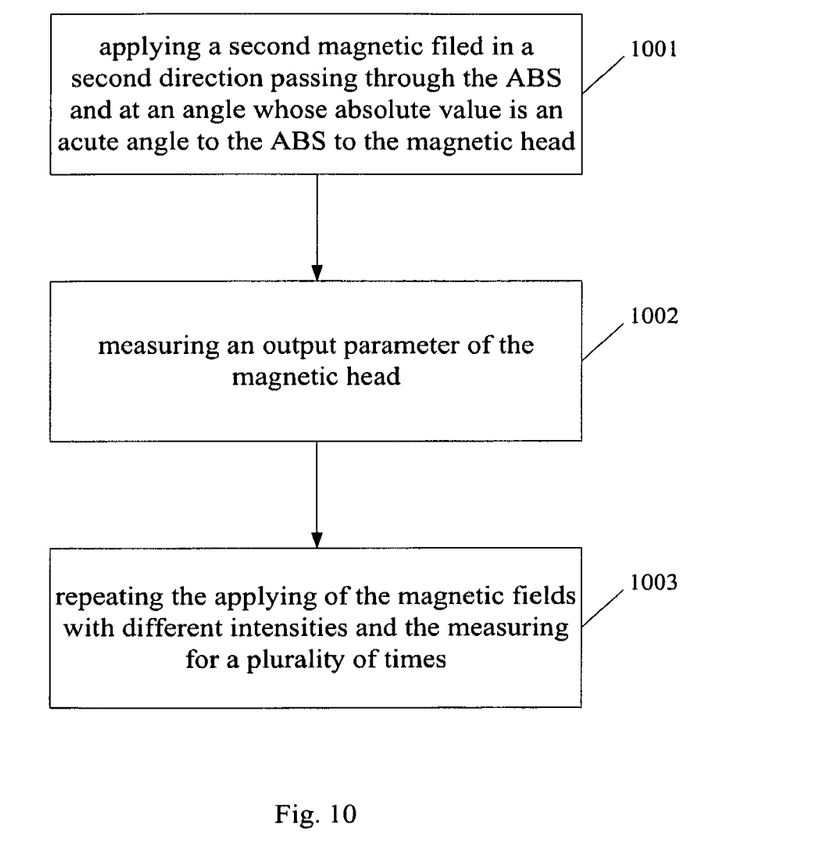
FIG. 10 is a flowchart of a method of testing the performance of a magnetic head according to one embodiment of the present invention.

FIG. 10 shows a flowchart of a method of testing performance of a magnetic head according to one embodiment of the present invention, which includes the follow steps at least.

Step (1001), applying a second magnetic filed in a second direction passing through the ABS and at an angle whose absolute value is an acute angle to the ABS to the magnetic head; and Step (1002), measuring an output parameter of the magnetic head;

Step (1003), repeating the applying of the magnetic fields with different intensities and the measuring for a plurality of times, thereby testing the performance of the magnetic head.

Within the conception of the present invention, one of ways to implement the step (1001) is controlling the magnetic head to make the ABS parallel to a horizontal plane, and then applying the second magnetic fields in the second direction that passes through the ABS and at an angle whose absolute value is an acute angle to the ABS, and then applying the second magnetic fields to the magnetic head. That is, the magnetic head is parallel to the horizontal plane and the magnetic field is tilted relative to the vertical line.

The other way to implement the step (1001) is controlling the magnetic head to make the ABS at the angle whose absolute value is an acute angle to a horizontal plane, and then applying the second magnetic fields to the magnetic head. That is, the magnetic head is tilted relative to the horizontal plane when perform this implementation.

If necessary, a first magnetic field in a first direction that is perpendicular to the ABS to the magnetic head can be applied during the QST, and a third magnetic field in a third direction that is parallel to the shielding layers and at 0° angle to the ABS can be applied, so as to test the output character of the magnetic field.

Similarly, as described above, the second direction can go in the ABS or go out from the ABS according to the actual testing. For one person ordinarily skilled in the art, the testing method in the present embodiments can includes all the technical features and obtain all advantages similar to the embodiments explained above according to explanation in the above embodiments, thus a same description is omitted here.

Figure 11:
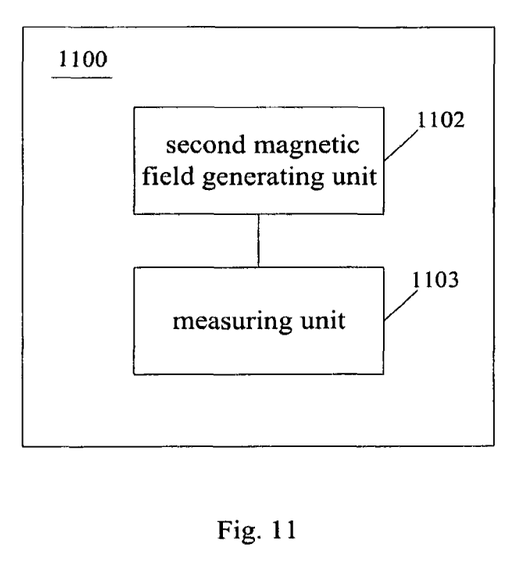
FIG. 11 shows an apparatus for testing the performance of a magnetic head according to one embodiment of the present invention.

Accordingly, FIG. 11 shows an apparatus for testing the performance of a magnetic head according to one embodiment of the present invention. As shown, the apparatus 1100 includes a second magnetic field generating unit 1102 for repeating to apply different second magnetic fields in a second direction passing through the ABS and at an angle whose absolute value is an acute angle to the ABS to the magnetic head, and a measuring unit 1103 measuring output parameters of the magnetic head according to the second magnetic fields, so as to test the performance of the magnetic head.

Concretely, the apparatus 1100 further comprises a first controlling unit (not shown) for controlling the magnetic head to make the ABS parallel to a horizontal plane.

Alternatively, the apparatus 1100 further comprises a second controlling unit for controlling the magnetic head to make the ABS at the angle whose absolute value is an acute angle to a horizontal plane.

Alternatively, under the different kinds of QST for testing the magnetic head, the apparatus 1100 can comprises a first magnetic field generating unit (not shown) for applying a first magnetic field in a first direction that is perpendicular to the ABS.

If necessary, a third magnetic field generating unit (not shown) for applying a third magnetic field with a third direction that is parallel to the shielding layers and at 0° angle to the ABS to the magnetic head also can be configured.

The apparatus 1100 performs the testing by using the testing method described above, a defective magnetic head having bad performance can be screened out with high precision can be screened out with high precision. For one person ordinarily skilled in the art, the apparatus in the present embodiments can includes all the corresponding technical features and obtain all advantages similar to the embodiments explained above according to the explanation in the above embodiments, thus a same description is omitted here.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A method of testing anti-high temperature performance of a read head of a magnetic head, the read head including two shielding layers and an air bearing surface, the method comprising:

repeatedly applying a plurality of first magnetic fields with different intensities in a first direction to the magnetic head, and measuring a first output parameter curve, the first direction being perpendicular to the air bearing surface;

repeatedly applying a plurality of second magnetic fields with different intensities in a second direction to the magnetic head, and measuring a second output parameter curve, the second direction passing through the air bearing surface and at an angle whose absolute value is an acute angle to the air bearing surface; and judging whether a variation that is beyond an allowable value is presented on the first output parameter curve and the second output parameter curve, thereby screening out a defective magnetic head, in the testing of the anti-high temperature performance of the magnetic head that includes the two shielding layers and the air bearing surface.

2. The method according to claim 1, wherein the method further comprises controlling the magnetic head to make the air bearing surface parallel to a horizontal plane, and then applying the second magnetic fields to the magnetic head.

3. The method according to claim 1, wherein the method further comprises controlling the magnetic head to make the air bearing surface at the angle to a horizontal plane, and then applying the second magnetic fields to the magnetic head.

4. The method according to claim 1, wherein the angle is in a range of −20°~20°, but 0° exclusive.

5. The method according to claim 1, wherein the first direction and the second direction go in the air bearing surface and/or go out from the air bearing surface.

6. The method according to claim 1, wherein the method further comprises applying a third magnetic field with a third direction to the magnetic head, and the third direction is parallel to the shielding layers and at 0° angle to the air bearing surface.

7. The method according to claim 1, wherein the intensity of the first magnetic field and the second magnetic field are in a range of −800 Oe~800 Oe.

8. The method according to claim 1, wherein the first output parameter curve and the second output parameter curve are represented by output voltage.

9. The method according to claim 1, wherein the first output parameter curve and the second output parameter curve are represented by signal-to-noise ratio.

10. The method according to claim 1, wherein the variation has a maximum jumping that has a jumping ratio, and the jumping ratio of the allowable value is 8%.

11. A method of testing the performance of a read head of a magnetic head, the read head including two shielding layers and an air bearing surface, the method comprising:
applying a second magnetic filed in a second direction passing through the air bearing surface and at an angle whose absolute value is an acute angle to the air bearing surface to the magnetic head, measuring an output parameter of the magnetic head, and repeating the applying of the magnetic fields with different intensities and measuring a plurality of times, thereby testing the performance of the magnetic head, in the testing of the performance of the magnetic head that includes the two shielding layers and the air bearing surface.

12. The method according to claim 11, wherein the method further comprises controlling the magnetic head to make the air bearing surface parallel to a horizontal plane, and then applying the second magnetic fields to the magnetic head.

13. The method according to claim 11, wherein the method further comprises controlling the magnetic head to make the air bearing surface at the angle to a horizontal plane, and then applying the second magnetic fields to the magnetic head.

14. The method according to claim 11, wherein the angle is in a range of −20°~20°, but 0° exclusive.

15. The method according to claim 11, wherein the second direction goes in the air bearing surface and/or goes out from the air bearing surface.

16. The method according to claim 11, wherein the method further comprises applying a first magnetic field in a first direction that is perpendicular to the air bearing surface to the magnetic head.

17. The method according to claim 11, wherein the method further comprises applying a third magnetic field with a third direction that is parallel to the shielding layers and at 0° angle to the air bearing surface to the magnetic head.

18. The method according to claim 11, wherein the intensity of the second magnetic field is in a range of −800 Oe~800 Oe.

19. The method according to claim 11, wherein the output parameter is represented by output voltage.

20. The method according to claim 11, wherein the output parameter is represented by signal-to-noise ratio.

21. The method according to claim 11, wherein the variation has a maximum jumping that has a jumping ratio, and the jumping ratio of the allowable value is 8%.

22. An apparatus for testing anti-high temperature performance of a read head of a magnetic head, the read head including two shielding layers and an air bearing surface, the apparatus comprising:
a first magnetic field generating unit for repeatedly applying a plurality of first magnetic fields with different intensities in a first direction to the magnetic head, the first direction being perpendicular to the air bearing surface;
a first measuring unit for measuring a first output parameter curve according to the first magnetic fields;
a second magnetic field generating unit for repeatedly applying a plurality of second magnetic fields with different intensities in a second direction to the magnetic head, the second direction passing through the air bearing surface and at an angle whose absolute value is an acute angle to the air bearing surface;
a second measuring unit for measuring a second output parameters according to the second magnetic fields; and
a judging unit for judging whether a variation that is beyond an allowable value is presented on the first output parameter curve and the second output parameter curve, thereby screening out a defective magnetic head, in the testing of the anti-high temperature performance of the magnetic head that includes the two shielding layers and the air bearing surface.

23. The apparatus according to claim 22, wherein the apparatus further comprises a first controlling unit for controlling the magnetic head to make the air bearing surface parallel to a horizontal plane.

24. The apparatus according to claim 22, wherein the apparatus further comprises a second controlling unit for controlling the magnetic head to make the air bearing surface at the angle to a horizontal plane.

25. The apparatus according to claim 22, wherein the angle is in a range of −20°~20°, but 0° exclusive.

26. The apparatus according to claim 22, wherein the first direction and the second direction go in the air bearing surface and/or go out from the air bearing surface.

27. The apparatus according to claim 22, wherein the apparatus further comprises a third magnetic field generating unit for applying a third magnetic field with a third direction to the magnetic head, and the third direction is parallel to the shielding layers and at 0° angle to the air bearing surface.

28. The apparatus according to claim 22, wherein the intensity of the first magnetic field and the second magnetic field are in a range of −800 Oe~800 Oe.

29. The apparatus according to claim 22, wherein the first output parameter curve and the second output parameter curve are represented by output voltage.

30. The apparatus according to claim 22, wherein the first output parameter curve and the second output parameter curve are represented by signal-to-noise ratio.

31. The apparatus according to claim 22, wherein the variation has a maximum jumping that has a jumping ratio, and the jumping ratio of the allowable value is 8%.

32. An apparatus for testing the performance of a read head of a magnetic head, the read head including two shielding layers and an air bearing surface, and the apparatus comprising:
- a second magnetic field generating unit for repeatedly repeating to apply second magnetic fields with different intensities in a second direction passing through the air bearing surface and at an angle whose absolute value is an acute angle to the air bearing surface to the magnetic head; and
- a measuring unit for measuring output parameters of the magnetic head according to the second magnetic fields, thereby testing the performance of the magnetic head, in the testing of the anti-high temperature performance of the magnetic head that includes the two shielding layers and the air bearing surface.

33. The apparatus according to claim 32, wherein further comprises a first controlling unit for controlling the magnetic head to make the air bearing surface parallel to a horizontal plane.

34. The apparatus according to claim 32, wherein the apparatus further comprises a second controlling unit for controlling the magnetic head to make the air bearing surface at the angle to a horizontal plane.

35. The apparatus according to claim 32, wherein the angle is in a range of −20°~20°, but 0° exclusive.

36. The apparatus according to claim 32, wherein the second direction goes in the air bearing surface and/or goes out from the air bearing surface.

37. The apparatus according to claim 32, wherein the apparatus further comprises a first magnetic field generating unit for applying a first magnetic field in a first direction that is perpendicular to the air bearing surface to the magnetic head.

38. The apparatus according to claim 32, wherein the apparatus further comprises a third magnetic field generating unit for applying a third magnetic field with a third direction to the magnetic head, and the third direction is parallel to the shielding layers and at 0° angle to the air bearing surface.

39. The apparatus according to claim 32, wherein the intensity of the second magnetic field is in a range of −800 Oe~800 Oe.

40. The apparatus according to claim 32, wherein the output parameter is represented by output voltage.

41. The apparatus according to claim 32, wherein the output parameter is represented by signal-to-noise ratio.

42. The apparatus according to claim 32, wherein the variation has a maximum jumping that has a jumping ratio, and the jumping ratio of the allowable value is 8%.

* * * * *